(12) United States Patent
Lee

(10) Patent No.: US 8,028,107 B2
(45) Date of Patent: Sep. 27, 2011

(54) APPARATUS AND METHOD FOR SERIAL TO PARALLEL IN AN I/O CIRCUIT

(75) Inventor: Cheng-Tao Lee, Taipei (TW)

(73) Assignee: VIA Technologies, Inc., Taipei (TW)

( * ) Notice: Subject to any disclaimer, the term of this patent is extended or adjusted under 35 U.S.C. 154(b) by 1344 days.

(21) Appl. No.: 11/380,759

(22) Filed: Apr. 28, 2006

(65) Prior Publication Data

US 2008/0168198 A1    Jul. 10, 2008

(51) Int. Cl.
G06F 13/12 (2006.01)
H03M 9/00 (2006.01)

(52) U.S. Cl. .......................................... 710/71; 341/100

(58) Field of Classification Search .................. 713/400, 713/600; 341/100, 101; 710/5, 6, 60, 65, 710/71
See application file for complete search history.

(56) References Cited

U.S. PATENT DOCUMENTS

| | | | | |
|---|---|---|---|---|
| 4,048,673 A | * | 9/1977 | Hendrie et al. | 710/305 |
| 5,223,833 A | * | 6/1993 | Akata | 341/100 |
| 5,426,784 A | * | 6/1995 | Kawata et al. | 713/600 |
| 5,864,309 A | * | 1/1999 | Hung | 341/61 |
| 5,926,120 A | * | 7/1999 | Swenson et al. | 341/100 |
| 6,169,501 B1 | * | 1/2001 | Ryan | 341/101 |
| 6,198,415 B1 | * | 3/2001 | Yoshikawa et al. | 341/100 |
| 6,259,387 B1 | * | 7/2001 | Fukazawa | 341/100 |
| 6,292,116 B1 | * | 9/2001 | Wang et al. | 341/100 |
| 6,295,234 B1 | * | 9/2001 | Schowe et al. | 365/189.12 |
| 6,373,414 B2 | * | 4/2002 | Koga et al. | 341/100 |
| 6,768,431 B2 | * | 7/2004 | Chiang | 341/100 |
| 7,420,869 B2 | * | 9/2008 | Lindorfer et al. | 365/233.1 |
| 7,675,439 B2 | * | 3/2010 | Chang et al. | 341/100 |
| 2004/0119618 A1 | * | 6/2004 | Mattos et al. | 341/100 |

* cited by examiner

Primary Examiner — Khanh Dang
(74) Attorney, Agent, or Firm — Muncy, Geissler, Olds & Lowe, PLLC

(57) ABSTRACT

A serial to parallel I/O circuit apparatus includes M sequential logic circuits and each of them includes a first D-type flip-flop for receiving one bit of input data, and the output of each the first D-type flip-flop connects to the input of a first D-type flip-flop of a next stage. A second D-type flip-flop receives one bit of enable control signal, and the output of each of the second D-type flip-flops connects to the input of a second D-type flip-flop of a next stage. A multiplexer contains two input terminals and an enable control signal receiving terminal, wherein one input terminal is used to receive the input data received by the first D-type flip-flop, and the enable control signal receiving terminal receives the enable control signal received by the second D-type flip-flop. A D-type latch outputs the data, and the output data is fed back to another input terminal of the multiplexer so as to be selected as a data output when a next set of data are input.

9 Claims, 11 Drawing Sheets

| Time | M-bit input data stream (M>=8) | Input data | D-type flip-flop output ($O_7O_6O_5O_4O_3O_2O_1O_0$) | Output ($Q_7Q_6Q_5Q_4Q_3Q_2Q_1Q_0$) |
|---|---|---|---|---|
| T0 | $I_{M-1}I_{M-2}...I_0$ | Null | 00000000 | $Q_7Q_6Q_5Q_4Q_3Q_2Q_1Q_0$ |
| T1 | $I_{M-1}I_{M-2}...I_1$ | $I_0$ | $I_0$0000000 | $Q_7Q_6Q_5Q_4Q_3Q_2Q_1Q_0$ |
| T2 | $I_{M-1}I_{M-2}...I_2$ | $I_1$ | $I_1I_0$000000 | $Q_7Q_6Q_5Q_4Q_3Q_2Q_1Q_0$ |
| T3 | $I_{M-1}I_{M-2}...I_3$ | $I_2$ | $I_2I_1I_0$00000 | $Q_7Q_6Q_5Q_4Q_3Q_2Q_1Q_0$ |
| T4 | $I_{M-1}I_{M-2}...I_4$ | $I_3$ | $I_3I_2I_1I_0$0000 | $Q_7Q_6Q_5Q_4Q_3Q_2Q_1Q_0$ |
| T5 | $I_{M-1}I_{M-2}...I_5$ | $I_4$ | $I_4I_3I_2I_1I_0$000 | $Q_7Q_6Q_5Q_4Q_3Q_2Q_1Q_0$ |
| T6 | $I_{M-1}I_{M-2}...I_6$ | $I_5$ | $I_5I_4I_3I_2I_1I_0$00 | $Q_7Q_6Q_5Q_4Q_3Q_2Q_1Q_0$ |
| T7 | $I_{M-1}I_{M-2}...I_7$ | $I_6$ | $I_6I_5I_4I_3I_2I_1I_0$0 | $Q_7Q_6Q_5Q_4Q_3Q_2Q_1Q_0$ |
| T8 | $I_{M-1}I_{M-2}...I_8$ | $I_7$ | $I_7I_6I_5I_4I_3I_2I_1I_0$ | $I_7I_6I_5I_4I_3I_2I_1I_0$ |
| T9 | $I_{M-1}I_{M-2}...I_9$ | $I_8$ | $I_8I_7I_6I_5I_4I_3I_2I_1$ | $I_7I_6I_5I_4I_3I_2I_1I_0$ |
| T10 | $I_{M-1}I_{M-2}...I_{10}$ | $I_9$ | $I_9I_8I_7I_6I_5I_4I_3I_2$ | $I_7I_6I_5I_4I_3I_2I_1I_0$ |
| T11 | $I_{M-1}I_{M-2}...I_{11}$ | $I_{10}$ | $I_{10}I_9I_8I_7I_6I_5I_4I_3$ | $I_7I_6I_5I_4I_3I_2I_1I_0$ |
| T12 | $I_{M-1}I_{M-2}...I_{12}$ | $I_{11}$ | $I_{11}I_{10}I_9I_8I_7I_6I_5I_4$ | $I_7I_6I_5I_4I_3I_2I_1I_0$ |
| T13 | $I_{M-1}I_{M-2}...I_{13}$ | $I_{12}$ | $I_{12}I_{11}I_{10}I_9I_8I_7I_6I_5$ | $I_7I_6I_5I_4I_3I_2I_1I_0$ |
| T14 | $I_{M-1}I_{M-2}...I_{14}$ | $I_{13}$ | $I_{13}I_{12}I_{11}I_{10}I_9I_8I_7I_6$ | $I_7I_6I_5I_4I_3I_2I_1I_0$ |
| T15 | $I_{M-1}I_{M-2}...I_{15}$ | $I_{14}$ | $I_{14}I_{13}I_{12}I_{11}I_{10}I_9I_8I_7$ | $I_7I_6I_5I_4I_3I_2I_1I_0$ |
| T16 | $I_{M-1}I_{M-2}...I_{16}$ | $I_{15}$ | $I_{15}I_{14}I_{13}I_{12}I_{11}I_{10}I_9I_8$ | $I_{15}I_{14}I_{13}I_{12}I_{11}I_{10}I_9I_8$ |

FIG. 7

| Truth table of multiplexers ||
|---|---|
| Enable control signal | Output(Q(t)) |
| 0 | Q(t-1) |
| 1 | B |

FIG. 8

| Time | N-bit input data stream $I(I_{N-1}I_{N-2}I_{N-3}\ldots I_0)$ | Enable control signal stream $E(E_{N-1}E_{N-2}E_{N-3}\ldots E_0)$ each assumed to be "1" | Input data | Enable control signal | First output $(B_M B_{M-1}\ldots B_0)$ | Output signal $(Q_7 Q_6 Q_5 Q_4 Q_3 Q_2 Q_1 Q_0)$ |
|---|---|---|---|---|---|---|
| T0 | Null("CLR") | Null | Null | | 00000000 | $Q_7 Q_6 Q_5 Q_4 Q_3 Q_2 Q_1 Q_0$ |
| T1 | $I_{N-1}I_{N-2}I_{N-3}\ldots I_0$ | $I_{N-1}I_{N-2}\ldots I_0$ | Null | | 00000000 | $Q_7 Q_6 Q_5 Q_4 Q_3 Q_2 Q_1 Q_0$ |
| T2 | $I_{N-1}I_{N-2}I_{N-3}\ldots I_1$ | $I_{N-1}I_{N-2}\ldots I_1$ | $I_0$ | $E_0$ | $I_0 0000000$ | $I_0 Q_7 Q_6 Q_5 Q_4 Q_3 Q_2 Q_1$ |
| T3 | $I_{N-1}I_{N-2}I_{N-3}\ldots I_2$ | $I_{N-1}I_{N-2}\ldots I_2$ | $I_1$ | $E_1$ | $I_1 I_0 000000$ | $I_1 I_0 Q_7 Q_6 Q_5 Q_4 Q_3 Q_2$ |
| T4 | $I_{N-1}I_{N-2}I_{N-3}\ldots I_3$ | $I_{N-1}I_{N-2}\ldots I_3$ | $I_2$ | $E_2$ | $I_2 I_1 I_0 00000$ | $I_2 I_1 I_0 Q_7 Q_6 Q_5 Q_4 Q_3$ |
| T5 | $I_{N-1}I_{N-2}I_{N-3}\ldots I_4$ | $I_{N-1}I_{N-2}\ldots I_4$ | $I_3$ | $E_3$ | $I_3 I_2 I_1 I_0 0000$ | $I_3 I_2 I_1 I_0 Q_7 Q_6 Q_5 Q_4$ |
| T6 | $I_{N-1}I_{N-2}I_{N-3}\ldots I_5$ | $I_{N-1}I_{N-2}\ldots I_5$ | $I_4$ | $E_4$ | $I_4 I_3 I_2 I_1 I_0 000$ | $I_4 I_3 I_2 I_1 I_0 Q_7 Q_6 Q_5$ |
| T7 | $I_{N-1}I_{N-2}I_{N-3}\ldots I_6$ | $I_{N-1}I_{N-2}\ldots I_6$ | $I_5$ | $E_5$ | $I_5 I_4 I_3 I_2 I_1 I_0 00$ | $I_5 I_4 I_3 I_2 I_1 I_0 Q_7 Q_6$ |
| T8 | $I_{N-1}I_{N-2}I_{N-3}\ldots I_7$ | $I_{N-1}I_{N-2}\ldots I_7$ | $I_6$ | $E_6$ | $I_6 I_5 I_4 I_3 I_2 I_1 I_0 0$ | $I_6 I_5 I_4 I_3 I_2 I_1 I_0 Q_7$ |
| T9 | $I_{N-1}I_{N-2}I_{N-3}\ldots I_8$ | $I_{N-1}I_{N-2}\ldots I_8$ | $I_7$ | $E_7$ | $I_7 I_6 I_5 I_4 I_3 I_2 I_1 I_0$ | $I_7 I_6 I_5 I_4 I_3 I_2 I_1 I_0$ |
| T10 | $I_{N-1}I_{N-2}I_{N-3}\ldots I_9$ | $I_{N-1}I_{N-2}\ldots I_9$ | $I_8$ | $E_8$ | $I_8 I_7 I_6 I_5 I_4 I_3 I_2 I_1$ | $I_8 I_7 I_6 I_5 I_4 I_3 I_2 I_1$ |
| T11 | $I_{N-1}I_{N-2}I_{N-3}\ldots I_{10}$ | $I_{N-1}I_{N-2}\ldots I_{10}$ | $I_9$ | $E_9$ | $I_9 I_8 I_7 I_6 I_5 I_4 I_3 I_2$ | $I_9 I_8 I_7 I_6 I_5 I_4 I_3 I_2$ |

FIG. 9

APPARATUS AND METHOD FOR SERIAL TO PARALLEL IN AN I/O CIRCUIT

BACKGROUND OF THE INVENTION

1. Technical Field

The present invention relates to an apparatus and method for an I/O circuit, in particular to an apparatus and method for serial to parallel in an I/O circuit.

2. Description of the Prior Art

In general, the number of pins of an IC is fixed after being manufactured. In the meantime, because of the trend of an SOC (system on a chip), a part of the pins must be shared so as to achieve an object of reducing IC size. Therefore, under the limitation of pin counts and the trend of SOC, it is an inevitable result that a single pin has multi-functions.

As shown in FIG. 1, a pin of an IC designed by using the concept of a single pin with a multifunction can possess many functions simultaneously, but at one time only a function can enable (i.e., the pin can be used by selecting only one of those functions each time). Thus a next function will not be shifted to until the present function is completed. Its speed is slower than that of an IC without any multifunction pin, and therefore is only suitable for use in a relatively slow bus. In addition, an additional pin as a chip select should be provided for function switching in the above architecture.

Generally, in order to overcome the advantage of insufficient output pins, such a way of a sequential logic circuit (as shown in FIG. 2A) may be used to extend pins. An I/O circuit can be formed by combining a plurality of sequential logic circuits, and each of which can process one bit of data. If there is a need to increase the number of outputs, it only needs to increase the number of the sequential logic circuits (as shown in FIG. 2B). Each sequential logic circuit comprises a D-type flip-flop and a D-type latch. For an M-bit input data stream I ($I_0 \ldots I_{M-3}I_{M-2}I_{M-1}$), one bit of the input data is input into the D-type flip-flop of the first sequential logic circuit each time in accordance with the bit sequence thereof. After the D-type flip-flop receives a set of input data, it will transfer the previously received input data to a next stage D-type flip-flop. When the input of data stream I ($I_0 \ldots I_{M-3}I_{M-2}I_{M-1}$) is completed, triggered by a clock signal CLK, the written input data stream I ($I_0 \ldots I_{M-3}I_{M-2}I_{M-1}$) is output to a corresponding D-type Latch for latching. Finally, triggered by another clock signal Load, the data stream I ($I_0 \ldots I_{M-3}I_{M-2}I_{M-1}$) is outputted, where M is greater than or equal to the number of the sequential logic circuits.

For example, FIG. 2C shows an 8-bit I/O circuit 200, which includes 8 sequential logic circuits. Firstly, the D-type flip-flop $D_0$ of a first sequential logic circuit 210 receives a first set of input data $I_0$ of a M-bit input data stream I ($I_0 \ldots I_{M-3}I_{M-2}I_{M-1}$) (M>=8) as its input data. Thereafter, when a second set of input data $I_1$ is input into the first D-type flip-flop $D_0$, $I_0$ is sent to the D-type flip-flop $D_2$ of the second sequential logic circuit 220 as its input data. Then, after a third set of input data $I_2$ is input into the first D-type flip-flop $D_0$, $I_1$ is sent to a second D-type flip-flop $D_1$ while $I_0$ is transmitted to a third D-type flip-flop $D_2$, ... etc. After the input of all the data stream I ($I_0 \ldots I_{M-3}I_{M-2}I_{M-1}$) (M>=8) is completed, being triggered by the clock signal CLK, the input data are outputted to corresponding D-type latches (for example, the first D-type flip-flop $D_0$ corresponds to a first gating latch $D_{G0}$), respectively, and the corresponding gating latches latch their input data, respectively. Finally, being triggered by a clock signal Load, all the input data stream I ($I_0 \ldots I_{M-3}I_{M-2}I_{M-1}$) (M>=8) are outputted simultaneously. Before the input data stream I ($I_0 \ldots I_{M-3}I_{M-2}I_{M-1}$) (M>=8) is written in, a clear signal CLR may be used to clear out the input data written previously in the D-type flip-flops. As can be seen from the input and output statuses in FIG. 7, the system will not output data until it is written in at least 8 bits.

FIG. 3 shows an operational flowchart of an existing I/O circuit, and the steps of which are described as follows:

Step 310: a clear signal CLR is inputted to clear out the input data written previously;

Step 320: the input data stream I ($I_0 \ldots I_{M-3}I_{M-2}I_{M-1}$) (M>=8) is input into the first D-type flip-flop one bit each time in order of bit, and when a next set of input data are inputted, the previous set of input data will be pushed to a next stage D-type flip-flop;

Step 330: after the input of the data stream I ($I_0 \ldots I_{M-3}I_{M-2}I_{M-1}$) (M>=8) is completed, triggered by the clock signal CLK, the input data are outputted to corresponding D-type latches for latching, respectively; and Step 340: triggered by the clock signal Load, the input data stream I latched by the D-type latch is output.

As can be seen from the above descriptions, the sequential logic circuits are designed with additional output pins in a series connection manner so as to overcome the problem of insufficient output pins in an IC. However, the output will not be performed until all the sequential logic circuits are fully written in each time, which might affect the whole system performance because of slow data transmission rate.

SUMMARY OF THE INVENTION

The present invention provides an apparatus and method for serial to parallel of an I/O circuit that enables an IC circuit to deliver input data quickly and efficiently, in addition to extending the output pins.

An I/O circuit for serial to parallel according to an embodiment of the present invention comprises M sequential logic circuits in series connection, each of which processes one bit of data, and the number of the sequential logic circuits may be increased as needed so as to extend the number of I/Os. Each sequential logic circuit includes two D-type flip-flops, a multiplexer, and a D-type latch. These two D-type flip-flops receive an input data and an enable control signal, respectively, while the multiplexer selects the type of output data. The D-type latch latches and outputs the data from the multiplexer.

A method for serial to parallel of an I/O circuit according to an embodiment of the present invention is as follows. Firstly, an N-bit input data stream is input one bit each time according to bit sequence. Secondly, the system determines, according to the status (high level or low level) of an enable control signal input synchronously, whether to output the input data or output a feedback data, which was output previously (remain unchanged).

BRIEF DESCRIPTIONS OF THE DRAWINGS

FIG. 7 is a status diagram of the output and input of a 8-bit I/O circuit.

FIG. 8 is a truth table of a multiplexer.

FIG. 9 is a status diagram of the output and input of a 8-bit I/O circuit of the present invention.

DETAILED DESCRIPTION OF THE INVENTION

The present invention provides an apparatus and method for serial to parallel of an I/O circuit that enables the I/O circuit to output the input data stream quickly without latency. The description will be given with an embodiment hereinafter. However, those skilled in the art will understand that it is only an example, and is not used to limit the invention itself. The embodiment related to the present invention will be described in detail below.

Figure 1:
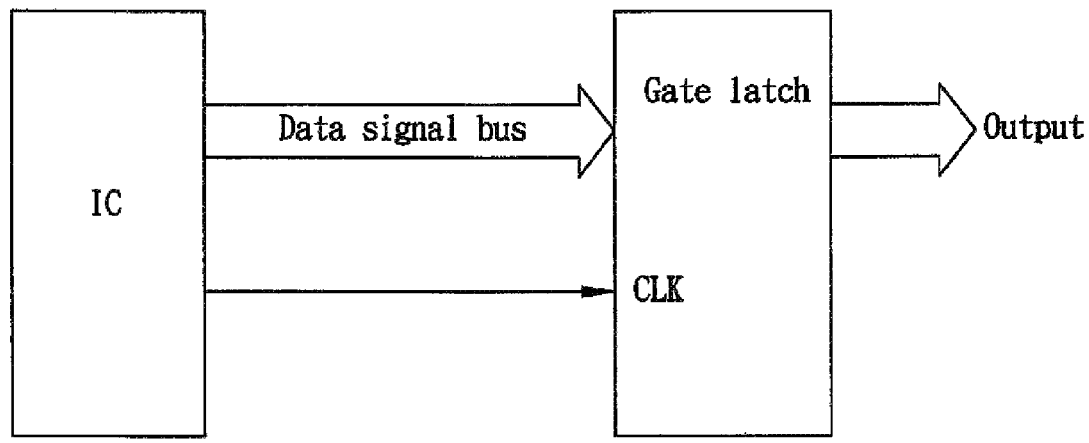
FIG. 1 is a schematic diagram showing the output of an IC with the pin multifunction concept.
Figure 2A:
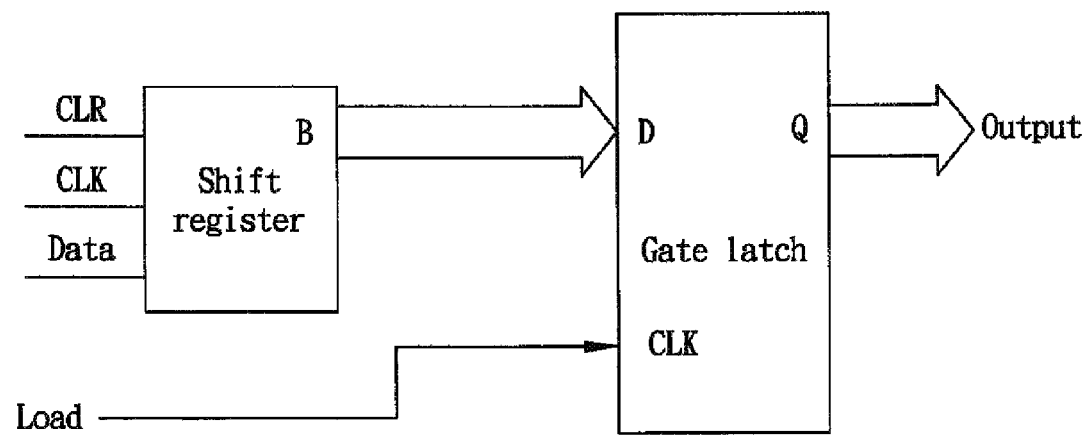
FIG. 2A is a schematic diagram of a sequential logic circuit.
Figure 2B:
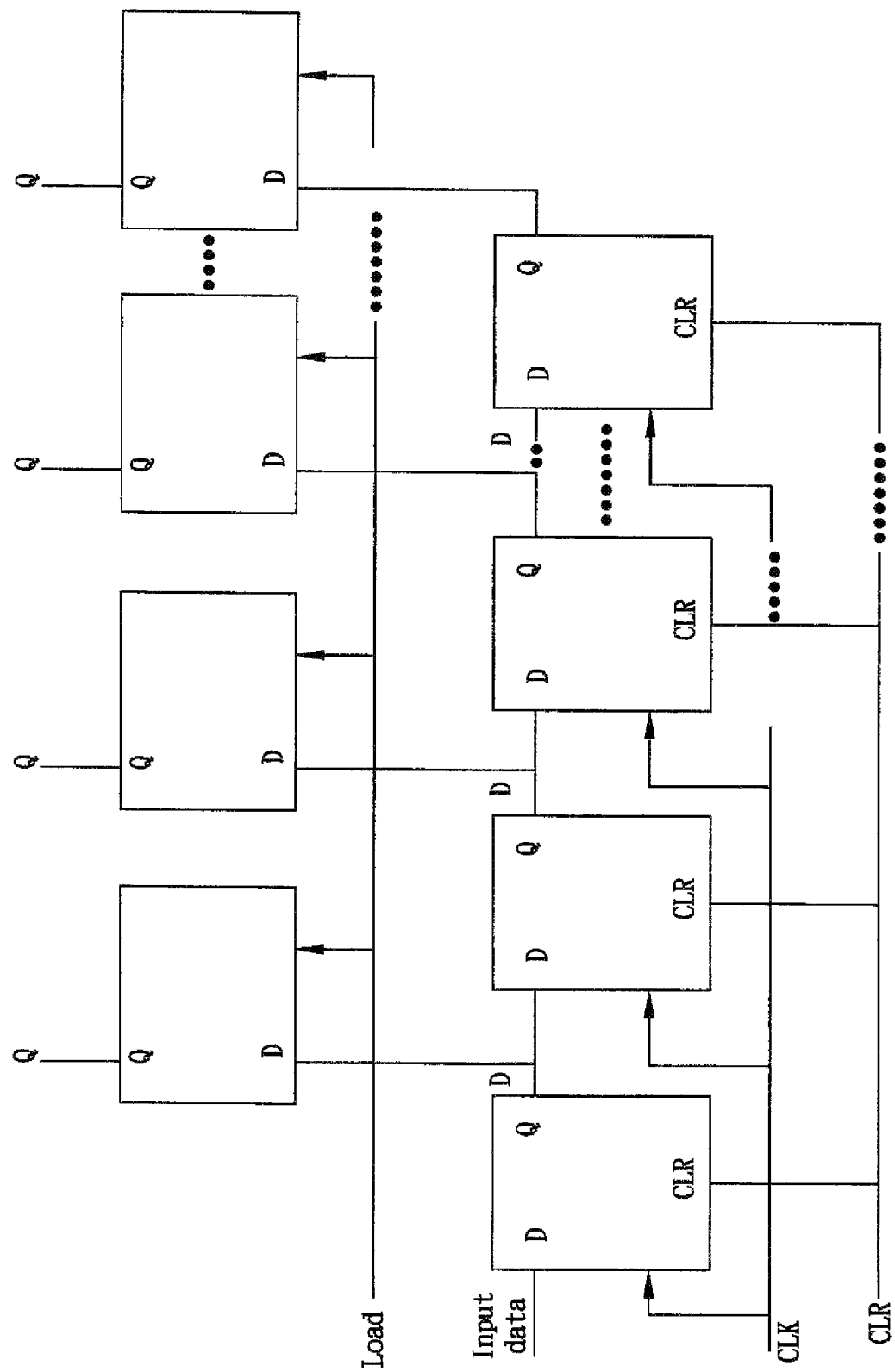
FIG. 2B is a schematic diagram of an I/O circuit combining a plurality of sequential logic circuits.
Figure 2C:
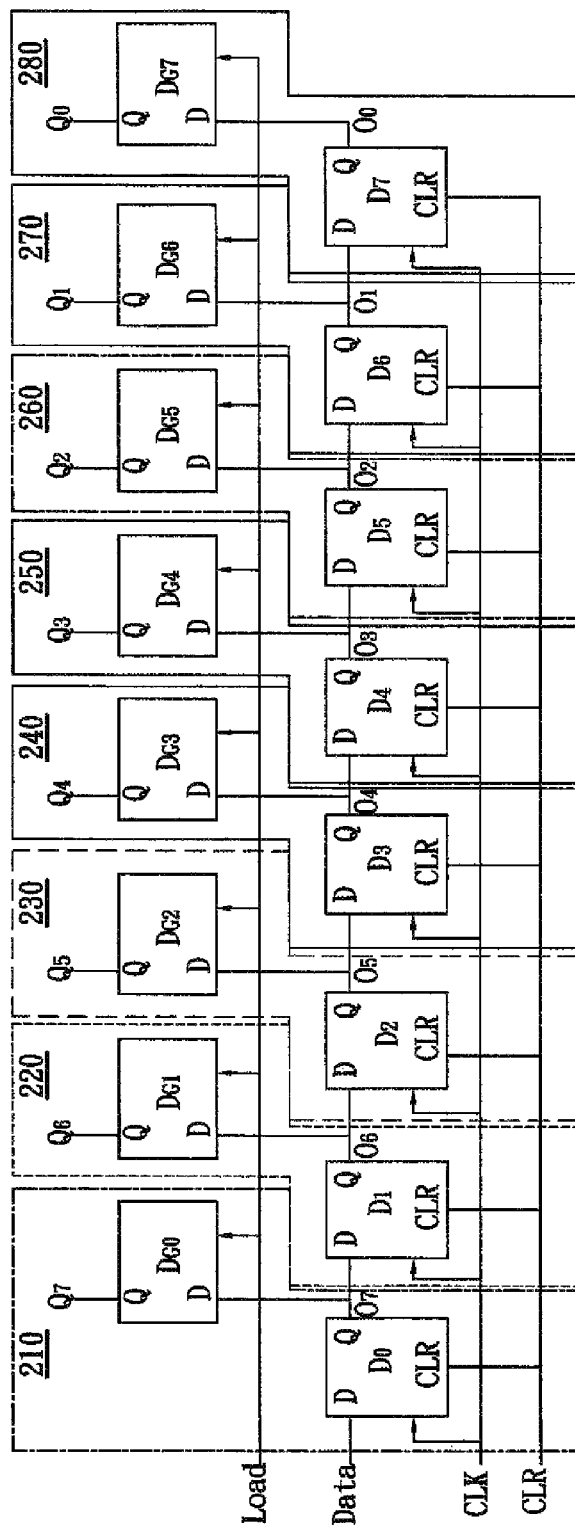
FIG. 2C is a schematic diagram of an 8-bit I/O circuit.
Figure 3:
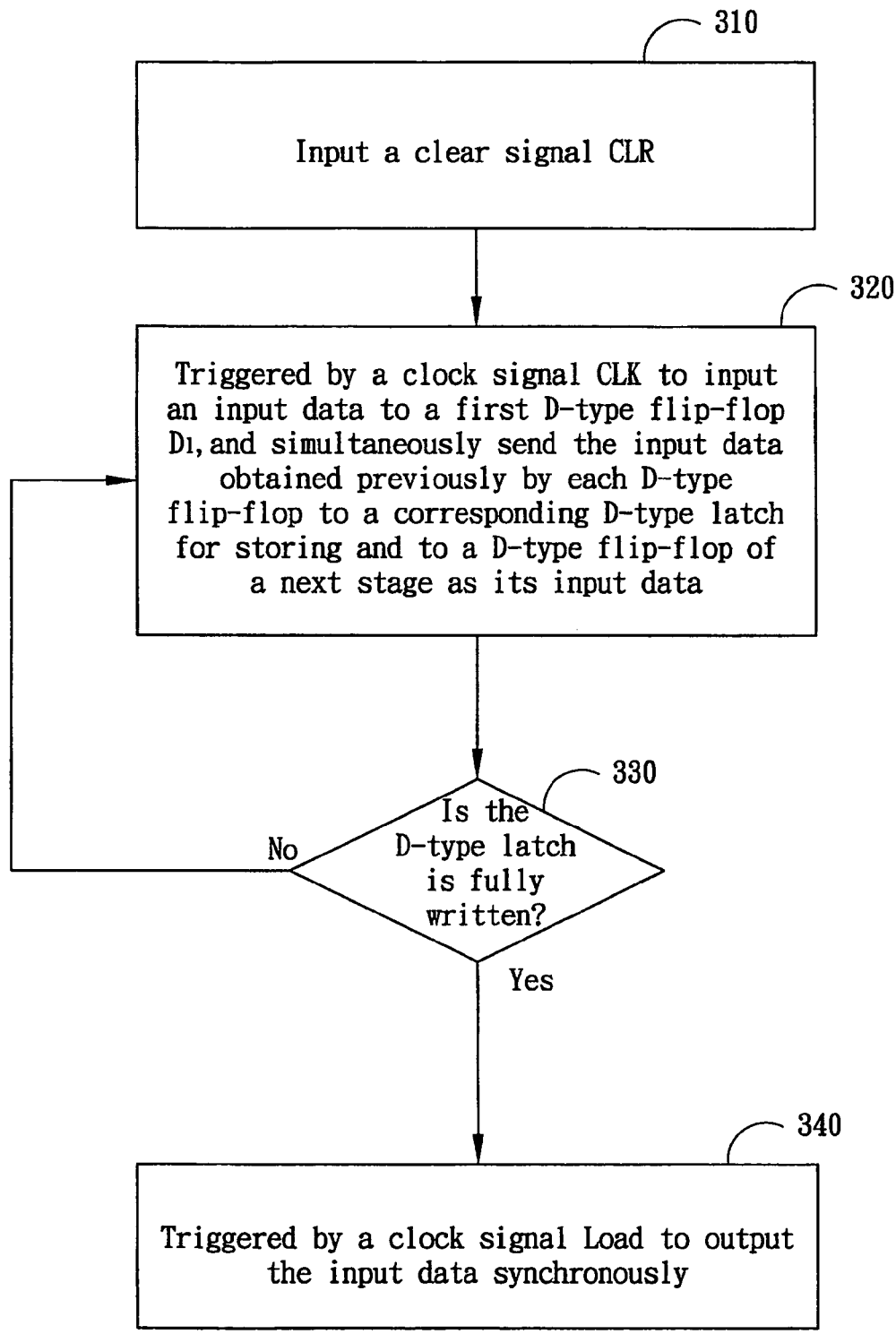
FIG. 3 is an operational flowchart of an I/O circuit.
Figure 4A:
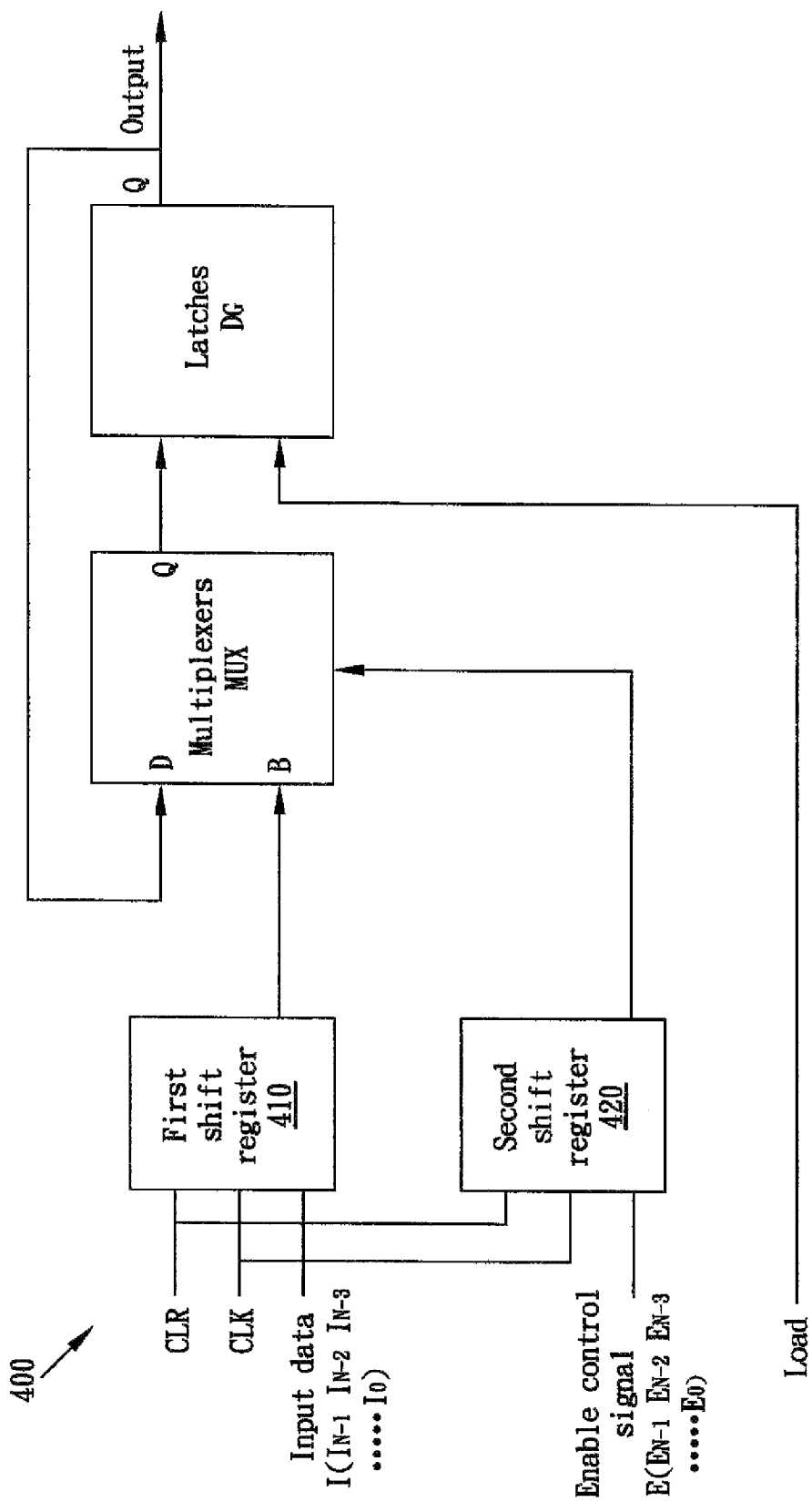
FIG. 4A is a first schematic diagram of a serial to parallel I/O circuit according to the present invention.
Figure 4B:
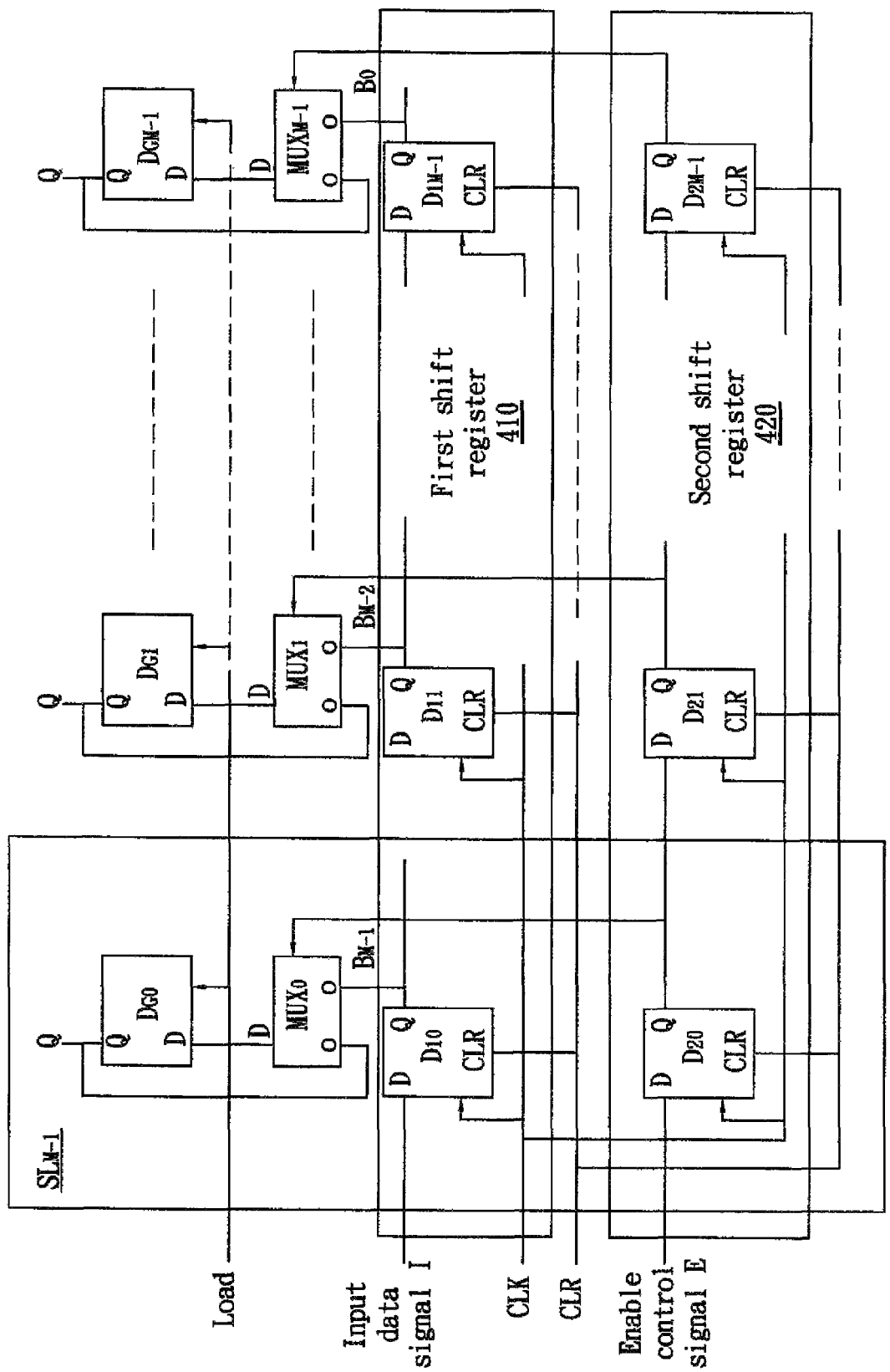
FIG. 4B is a second schematic diagram of a serial to parallel I/O circuit according to the present invention.

FIG. 4A shows a serial to parallel apparatus 400 of an I/O circuit according to one embodiment of the present invention, and FIG. 4B shows a detailed structural diagram of FIG. 4A. The circuit shown in FIG. 4B comprises M sequential logic circuits SL ($SL_0$, $SL_1$, ..., $SL_{M-1}$), while each sequential logic circuit includes a first D-type flip-flop, a second D-type flip-flop, a multiplexer, and a D-type latch. One of first D-type flip-flops $D_1$ ($D_{10}$, $D_{11}$, ..., $D_{1M-1}$) receives one bit of input data, and the output of each first D-type flip-flop is directed to the input of a first D-type flip-flop of a next stage. For example, the output of the flip-flop $D_{10}$ is coupled with the input of a flip-flop $D_{11}$, which is the next stage of the flip-flop $D_{10}$. One of second D-type flip-flops $D_2$ ($D_{20}$, $D_{21}$, ..., $D_{2M-1}$) receives one bit of an enable control signal, and the output of each second D-type flip-flop is directed to the input of a second D-type flip-flop of a next stage. For example, the output of the flip-flop $D_{20}$ is coupled to the input of a flip-flop $D_{21}$, which is the next stage of the flip-flop $D_{20}$. Each one of multiplexers MUX ($MUX_0$, $MUX_1$, ..., or $MUX_{M-1}$) has two input terminals, while one of which is connected to the output of a corresponding D-type flip-flop so as to receive the input data received by relative first D-type flip-flops. For example, the flip-flop $D_{10}$ will direct the input data it received to the first multiplexer $MUX_0$. Additionally, each multiplexer further has an enable control signal receiving terminal connected to the output of a corresponding second D-type flip-flop, used for receiving an enable control signal received by the second D-type flip-flop. For example, the first multiplexer $MUX_0$ connected to a first second D-type flip-flop $D_{20}$ will receive an enable control signal delivered from the flip-flop $D_{20}$. One of D-type latches $D_G$ ($D_{G0}$, $D_{G1}$, ..., $D_{GM-1}$) connects to a corresponding multiplexer so as to output the data selected by the corresponding multiplexer, and the output data is fed back to another input terminal of the corresponding multiplexer, which is also taken as feedback data so as to be selected for data output when a next set of input data are input. For example, a first D-type latch $D_{G0}$ connected to a first multiplexer $MUX_0$ outputs the data selected by the first multiplexer $MUX_0$, and feeds back its output data to another input terminal of the first multiplexer $MUX_0$. As shown in FIG. 4B, M first D-type flip-flops $D_1$ ($D_{10}$, $D_{11}$, ..., $D_{1M-1}$) are combined to form a first shift register 410, while M second D-type flip-flops $D_2$ ($D_{20}$, $D_{21}$, ..., $D_{2M-1}$) are combined to form a second shift register 420.

A method for serial to parallel of an I/O circuit of the present invention is as follows. First a clear signal CLR is asserted to all first D-type flip-flops $D_1$ ($D_{10}$, $D_{11}$, ..., $D_{1M-1}$) and all second D-type flip-flops $D_2$ ($D_{20}$, $D_{21}$, ..., $D_{2M-1}$), respectively, so as to clear out previously input signals stored therein. At which time the data in all the first D-type flip-flop $D_1$ ($D_{10}$, $D_{11}$, ..., $D_{1M-1}$) are each null, the enable control signals in all the second D-type flip-flops $D_2$ ($D_{20}$, $D_{21}$, ..., $D_{2M-1}$) are each of a low level (0), therefore the system will select to keep the original output status. A truth table related to operation of one of the multiplexers is as shown in FIG. 8. When the enable control signal is of a high level (1), a multiplexer selects the input data as its output, and when the enable control signal is of a low level (0), the multiplexer selects the feedback data as its output. Next, an N-bit input data stream I ($I_0 ... I_{N-3}I_{N-2}I_{N-1}$) and an N-bit enable control signal stream E ($E_0 ... E_{N-3}E_{N-2}E_{N-1}$) are input simultaneously. The input data stream I and the enable control signal E are input into the flip-flop $D_{11}$ and the flip-flop $D_{20}$, respectively, one bit each time according to the bit sequence, and the two signals are controlled by a clock signal CLK simultaneously.

When triggered by the clock signal CLK, the flip-flop $D_{10}$ receives a first set of input data $I_0$, while the flip-flop $D_{20}$ receives a first set of enable control signals $E_0$. When triggered again by the clock signal CLK, the second set of input data $I_1$ and the second set of enable control signals $E_1$ are input into the flip-flop $D_{10}$ and the flip-flop $D_{20}$, respectively. $I_0$ is simultaneously output to the input terminal of the first multiplexer $MUX_0$ and the flip-flop $D_{11}$, and $E_0$ is simultaneously output to the enable control signal receiving terminal of the first multiplexer $MUX_0$ and flip-flop $D_{21}$. At this time, the first multiplexer $MUX_0$ selects to output $I_0$ according to the status of the received enable control signal $E_0$ (suppose that $E_0$ is of a high level (1)), then delivers $I_0$ to the first D-type latch $D_{G0}$ for latching. The first D-type latch $D_{G0}$ does not output $I_0$ until triggered by the clock signal Load, and meanwhile $I_0$ is fed back to another input terminal of the first multiplexer $MUX_0$ as feedback data, so as to be selected as the output for the next set of data.

Next, when triggered again by the clock signal CLK, a third set of input data $I_2$ and a third set of enable control signals $E_2$ are input into the flip-flop $D_{10}$ and the flip-flop $D_{20}$ respectively. $I_1$ is simultaneously output to an input terminal of the first multiplexer $MUX_0$ and the flip-flop $D_{11}$, while $E_1$ is simultaneously output to the enable control signal receiving terminal of the first multiplexer $MUX_0$ and the flip-flop $D_{21}$. On the other hand, $I_0$ is simultaneously output to the input terminal of the second multiplexer $MUX_1$ and the third first D-type flip-flop $D_{12}$, and $E_0$ is simultaneously output to the enable control signal receiving terminal of the second multiplexer $MUX_1$ and a third second D-type flip-flop $D_{22}$. At this time, the first multiplexer $MUX_0$ selects to output the input data $I_1$ or the feedback data $I_0$ according to the status of the received enable control signal $E_1$ (i.e., $I_1$ is selected to be output when the enable control signal $E_1$ received by the first multiplexer $MUX_0$ is of a high level (1), and $I_0$ is selected to be output when the enable control signal $E_1$ received by the first multiplexer $MUX_0$ is of a low level (0)). Likewise, the second multiplexer $MUX_1$ will also select data to output ($I_0$ or the output data previously fed back) based on the status of the received enable control signal $E_0$. Finally the data selected by the first multiplexer $MUX_0$ and the second multiplexer $MUX_1$ are sent to the first D-type latch $D_{G0}$ and the second D-type latch $D_{G1}$ for latching, and will be output simultaneously after triggered again by the clock signal Load. The output data thereof are fed back to another input terminal of each of the first multiplexer $MUX_0$ and the second multiplexer $MUX_1$ as to be feedback data so as to be selected as output for a next set of data output. The input status of subsequent data may be performed similarly, but it should be noted that both M and N are positive integers greater than 1.

Figure 5:
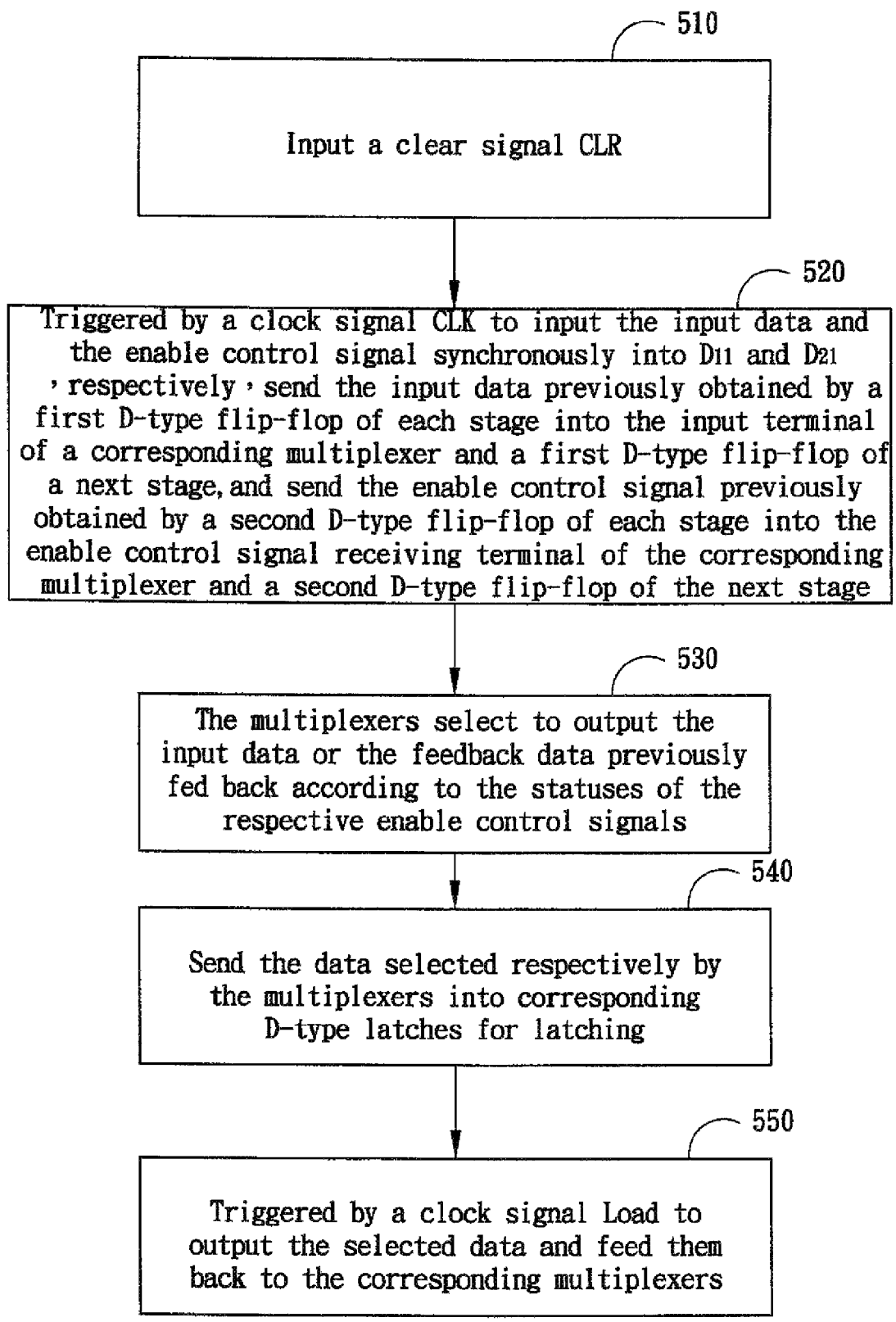
FIG. 5 is an operational flowchart of a method for serial to parallel of an I/O circuit according to the present invention.

FIG. 5 shows an operational flowchart according to an embodiment of the present invention, the steps thereof are as follows:

Step 510: assert a clear signal CLR;

Step 520: input an input data stream I ($I_0 \ldots I_{N-3} I_{N-2} I_{N-1}$) and an enable control signal stream E ($E_0 \ldots E_{N-3} E_{N-2} E_{N-1}$);

Step 530: triggered by a clock signal CLK, input the input data stream I and the enable control signal stream E sequentially into the flip-flop $D_{10}$ and the flip-flop $D_{20}$, respectively, one bit each time according to bit sequence;

Step 540: triggered again by the clock signal CLK, send previously obtained input data $I_a$ ($0 \leq a \leq N-1$, a should be an integer) into a first D-type flip-flop of a next stage and the input terminal of a corresponding multiplexer, and send the enable control signal $E_a$ ($0 \leq a \leq N-1$, a should be an integer) to a second D-type flip-flop of the next stage and the enable control signal receiving terminal of the corresponding multiplexer MUX;

Step 550: after the corresponding multiplexer MUX receives the input data $I_a$ ($0 \leq a \leq N-1$, a should be an integer) and the enable control signal $E_a$ ($0 \leq a \leq N-1$, a should be an integer), the corresponding multiplexer MUX selects to output the input data $I_a$ ($0 \leq a \leq N-1$) or feedback data $I_{a-1}$ ($0 \leq a \leq N-1$) previously fed back according to the status of the enable control signal $E_a$ ($0 \leq a \leq N-1$, a should be an integer);

Step 560: direct the data ($I_a$ or $I_{a-1}$) selected by the corresponding multiplexer to a corresponding D-type latch $D_G$ for latching; and Step 570: triggered by a clock signal Load to output the selected data and feed back them to the corresponding multiplexers.

Taking the serial to parallel of an 8-bit I/O circuit as an example, the 8-bit serial to parallel I/O circuit comprises 8 sequential logic circuits SL ($SL_0$, $SL_1$, $SL_2$, $SL_3$, $SL_4$, $SL_5$, $SL_6$, $SL_7$) in series connection. The eight sequential logic circuits SL ($SL_0$, $SL_1$, $SL_2$, $SL_3$, $SL_4$, $SL_5$, $SL_6$, $SL_7$) include 8 first D-type flip-flops $D_1$ ($D_{10}$, $D_{11}$, $D_{12}$, $D_{13}$, $D_{14}$, $D_{15}$, $D_{16}$, $D_{17}$), eight second D-type flip-flops $D_2$ ($D_{20}$, $D_{21}$, $D_{22}$, $D_{23}$, $D_{24}$, $D_{25}$, $D_{26}$, $D_{27}$), eight multiplexers MUX ($MUX_0$, $MUX_1$, $MUX_2$, $MUX_3$, $MUX_4$, $MUX_5$, $MUX_6$, $MUX_7$), and eight D-type latches $D_G$ ($D_{G0}$, $D_{G1}$, $D_{G2}$, $D_{G3}$, $D_{G4}$, $D_{G5}$, $D_{G6}$, $D_{G7}$). In addition, the 8-bit serial to parallel I/O circuit further comprises an N-bit input data stream I ($I_0 \ldots I_{N-3} I_{N-2} I_{N-1}$), an N-bit enable control signal stream E ($E_0 \ldots E_{N-3} E_{N-2} E_{N-1}$), a clear signal CLR, a clock signal CLK and a clock signal Load.

Figure 6:
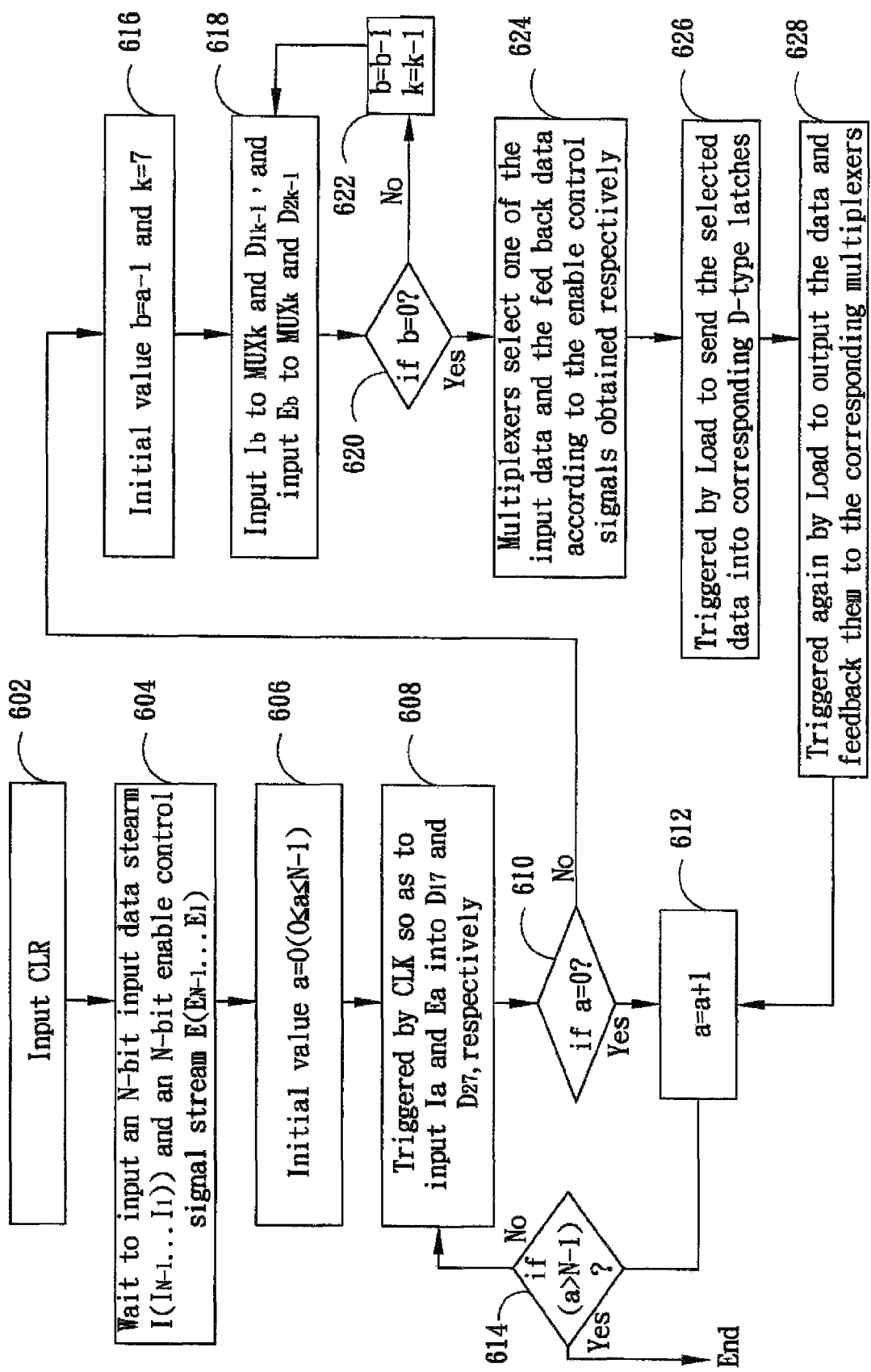
FIG. 6 is an operational flowchart of a method for serial to parallel of an 8-bit I/O circuit according to the present invention.

The flowchart thereof is as shown in FIG. 6:

Step 602: input a clear signal CLR;

Step 604: wait for the input of an N-bit input data stream I ($I_0 \ldots I_{N-3} I_{N-2} I_{N-1}$) and an N-bit enable control signal stream E ($E_0 \ldots E_{N-3} E_{N-2} E_{N-1}$);

Step 606: set an initial value a=0 ($0 \leq a \leq N-1$);

Step 608: triggered by a clock signal CLK so as to synchronously input the input signal Ia and the enable control signal Ea into $D_{10}$ and $D_{20}$, respectively;

Step 610: determine whether a is 0, and if a is 0, jump to step 612, otherwise jump to step 616;

Step 612: let a=a+1

Step 614: determine whether a is greater than N-1, and if yes, finish the input, if no, return to step 608;

Step 616: set an initial value b=a-1 and k=0;

Step 618: input $I_b$ into $MUX_k$ and $D_{1k+1}$, and input $E_b$ into $MUX_k$ and $D_{2k+1}$;

Step 620: determine whether b is 0, and if b is not 0, jump to step 622, otherwise jump to step 624;

Step 622: let b=b−1 and k=k+1, then jump to step 618 and step 620;

Step 624: multiplexers select one of the input data and the fed back data according to the enable control signals obtained respectively;

Step 626: triggered by a clock signal Load to send the selected data to a corresponding D-type latch for storing; and Step 628: triggered again by the clock signal Load to output the data and feedback it to the corresponding multiplexer.

As can be seen from FIG. 9, an 8-bit I/O circuit output and input status table, if only one bit of data is modified, in comparison with the prior art that the output will not be made until 8 bits of data are written, the I/O efficiency of the present invention is enhanced by 8 times (only ⅛ of the original time is needed). Additionally, if two bits of data are to be modified, then in comparison with the prior art, the I/O efficiency of the present invention is enhanced by 4 times (only ¼ of the original time is needed).

The apparatus and method for serial to parallel of an I/O circuit according to the present invention does not necessary to wait for the sequential logic circuits being fully written data before output altogether. That is, each time when one bit of data is input, the system can make an output at once, thus what is needed is to complete the input of all the necessary number of data bits. Therefore, in comparison with the prior art that the output can only be made until the sequential logic circuits are fully written, the present invention features high speed, saves time and enhances the I/O efficiency.

While the present invention is described above with respect to a preferred embodiment of an 8-bit I/O circuit, it is not used to define that the spirit and inventive entity of the present invention is limited to the above embodiments. It can contain arbitrary bits I/O circuit, which is covered by the spirit of the present invention. Therefore, all modifications without departing from the spirit and scope of the present invention are contained in the scope of the attached claims.

What is claimed is:

1. A serial to parallel input/output circuit, comprising a plurality of selecting elements, each including:
   a first input terminal for receiving a first input signal;
   a second input terminal for receiving a second input signal;
   an enable control signal receiving terminal for receiving an enable control signal so as to determine whether the selecting element selects the first input signal or the second input signal; and
   an output terminal;
   a plurality of first storage elements, each of the first storage elements for receiving an input data, wherein an output terminal of each of the first storage element is coupled to an input terminal of a next first storage element and also coupled to the first input terminal of a corresponding one of the plurality of selecting elements, for sending an input data received by a first input terminal to the corresponding selecting element as a first input signal;
   a plurality of second storage elements, each of the second storage elements for receiving an enable control signal, wherein an output terminal of each of the second storage elements is coupled to an input terminal of a next second storage element and also coupled to an enable control signal receiving terminal of one of the corresponding selecting elements, for sending an enable control signal received by the second storage element to the corresponding selecting element; and
   a plurality of third storage elements, wherein an input terminal of each of the third storage elements is coupled to the output terminal of one of the corresponding selecting element, for outputting a data selected by the corresponding selecting element and feeding back the data signal output by the selecting element to a second input terminal of the selecting element so as to be selected as a second input signal for outputting a next set of data signals, wherein bits of an input data signal stream are input into the first storage element sequentially and can be output an once as soon as having received the input data signal, without waiting for all the data are written in the plurality of first storage elements.

2. The serial to parallel input/output circuit according to claim 1 wherein when a next input data is input, the first storage element sends the input data already received to a first storage element of a next stage.

3. The serial to parallel input/output circuit according to claim 1 wherein the enable control signal stream is input into the second storage element one bit each time as the enable control signal according to bit sequence, and when a next enable control signal is input, the second storage element sends the enable control signal already received to a second storage element of a next stage.

4. The serial to parallel input/output circuit according to claim 1 wherein:

when the enable control signal received by the second storage element is of a first level, the corresponding selecting element selects the first input signal for selecting the input data received by the corresponding first storage element as the output of the third storage element; and when the enable control signal received by the second element is of a second level, the corresponding selecting element selects the second input signal for selecting the feedback data fed back by the previous outputting as the output of the third storage element so as to keep the output of the third storage element unchanged.

5. A method for serial to parallel of an input/output circuit system outputs an input data at once without waiting for the serial to parallel input/output circuit system to finish a writing of all the input data, comprising the step of:

inputting an input data received by an input terminal of a first storage element, wherein the input data is one bit of an input data stream, and the input data stream is input into a serial to parallel input/output circuit sequentially and each time one bit of the input data is input;

inputting an enable control signal received by an input terminal of a second storage element, wherein:

when the enable control signal is of a first level, the serial to parallel input/output circuit system selecting the input data as its input; and when the enable control signal is of a second level, the serial to parallel input/output circuit system selecting a feedback data as its output; and outputting a data from the input data or the feedback data according to the enable control signal;

wherein the input data is one bit of an input data stream, and the intput data stream is input in the serial to parallel input/output circuit system sequentially, and when each one bit of the input data stream is input, the serial to parallel input/output circuit system will output the input data immediately without waiting until all the data is written in the plurality of first storage elements.

6. The method for serial to parallel of an input/output circuit according to claim 5 wherein a previous set of output data is fed back to the serial to parallel input/output circuit system to formed as the feedback data.

7. The method for serial to parallel of an input/output circuit according to claim 5 wherein the enable control signal is one bit of an enable control signal stream, and the enable control signal stream is input into the serial to parallel input/output circuit system sequentially.

8. The method for serial to parallel of an input/output circuit according to claim 5 wherein the enable control signal and the input data are synchronous.

9. The method for serial to parallel of an input/output circuit according to claim 5, further comprising eliminating the previous input when the serial to parallel input/output circuit system receives the current input data and the enable control signal.

* * * * *